United States Patent [19]
Morimoto

[11] Patent Number: 5,917,846
[45] Date of Patent: Jun. 29, 1999

[54] OPTICAL SEMICONDUCTOR DEVICE WITH CARRIER RECOMBINATION LAYER

[75] Inventor: Takao Morimoto, Tokyo, Japan

[73] Assignee: NEC Corporation, Tokyo, Japan

[21] Appl. No.: 08/824,435

[22] Filed: Mar. 26, 1997

[30] Foreign Application Priority Data

Mar. 28, 1996 [JP] Japan .................................. 8-073690

[51] Int. Cl.$^6$ ........................................................ H01S 3/19
[52] U.S. Cl. .................................. 372/46; 372/45; 257/14
[58] Field of Search ...................... 372/45, 46; 257/184, 257/187, 18, 14

[56] References Cited

U.S. PATENT DOCUMENTS

| 5,339,325 | 8/1994 | Kito et al. ................................. 372/45 |
| 5,343,054 | 8/1994 | Maroney, III et al. ................. 257/184 |
| 5,559,818 | 9/1996 | Shono et al. ............................. 372/45 |
| 5,636,237 | 6/1997 | Terakado et al. ........................ 372/46 |

FOREIGN PATENT DOCUMENTS

| 5-299764 | 11/1993 | Japan . |
| 6-338654 | 12/1994 | Japan . |

OTHER PUBLICATIONS

T. Terakado et al.; "Extremely Low Trhresholds (O.4mA @ 20'C, 3.0mA @85'C) . . . TBP"; 14th Laser Conference, paper PD9 (1994), pp. 21–22.

Y. Sakata et al.; "Improved performance of MQW BH–LDs with current blocking structure fabricated . . . process"; Tech. Digest of IOOC '95, paper FB2–3, (1995), pp. 46–47.

Japanese Office Action dated Mar. 24, 1998 with English language translation of Japanese Examiner's comments.

Sakata, Y., et al., "All selective MOVPE grown 1.3$\mu$m strained MQW BH–LDs," *Technical Report of IEICE*, vol. 95, No. 294, pp. 39–44, Oct. 17, 1995.

Sakata, Y., et al., "All Selective MOVPE Grown BG–LD's Fabricated by the Novel Self–Alignment Process," *IEEE Photonics Technology Letters*, vol. 8, No. 2, pp. 179–181, Feb. 1996.

*Primary Examiner*—Rodney Bovernick
*Assistant Examiner*—Yisun Song
*Attorney, Agent, or Firm*—Whitham, Curtis & Whitham

[57] ABSTRACT

A p-InP buffer layer is formed on a p-type InP substrate. A selective growth layer consisted of a p-InP clad layer, a SCH-strained MQW layer, and an n-InP clad layer sequentially in stripe form is formed on the buffer layer. On the surface of the buffer layer at both sides of the selective growth portion, a p-InP buried layer, an n-InP blocking layer, a p-InP blocking layer and SCH-MQW carrier recombination layer are selectively grown in the sequential order in a manner that those layer are not grown on the upper surface of the selective growth portion. With burying upper portions of these layers, an n-InP clad burying layer, and an n-InGaAsP contact layer are formed. Then, a surface electrode is formed with covering the entire surface. Also, a back surface electrode is formed on the backside surface of the p-type InP substrate.

30 Claims, 6 Drawing Sheets

OPTICAL SEMICONDUCTOR DEVICE WITH CARRIER RECOMBINATION LAYER

BACKGROUND OF THE INVENTION

1. Field of the Invention

The present invention relates generally to an optical semiconductor device, in which a semiconductor laser and an optical modulator or the like or integrating those. More specifically, the invention relates to an optical semiconductor device having a carrier recombination layer.

2. Description of the Prior Art

In a field of an optical communication in subscriber loop system, a semiconductor laser which does not require a temperature adjustment by a Peltier element or the like and auto power control (APC), has been desired for lowering of cost. In order to obtain a high optical output semiconductor laser used in a field of optical communication, it is required to have a structure which is difficult to turn on a pnpn current blocking layer of a thyristor structure upon high temperature or high current application. As a laser which can prevent the pnpn current blocking layer from turning on by charge-up, it has been known as a RIB-PBH (Recombination layer Inserted Blocking-Planar Buried Heterostructure) laser, in which a carrier recombination layer of InGaAsP, for example, is inserted in the blocking layer (T. Terakado, et al., "Extremely Low Thresholds 1.3 μm Strained MQW Lasers with Novel p-substrate Buried-Heterostructure (RIBPBH) Grown by MOVPE Using TBA and TBP", 14$^{th}$ Laser Conference, paper PD9, (1994)).

However, in fabrication process of RIB-PBH laser, semi-conductor etching process is required. Thus, such fabrication process merely achieves low uniformity and reproductivity.

In the recent years, as a laser which can improve uniformity and reproductivity with making semiconductor etching process unnecessary, "MQW BH-LDs with current blocking structure fabricated MOVPE and novel self alignment process" has been disclosed (Y. Sakata, et al., "Improved performance of MQW BH-LDs with current blocking structure fabricated MOVPE and novel self alignment process", Tech. Dig. of IOOC '95, paper FB2-3, (1995)).

FIG. 1 is a section showing a structure of the conventional MQW (Multi-Quantum Well) BH-LDs. A fabrication process of this laser diode will be discussed hereinafter. At first, a p-InP buffer layer 2 is formed on a p-type InP substrate having surface of (100) plane. Then, a silicon dioxide layer having an opening portion extending in [011] orientation is formed on the surface of the p-InP buffer layer 2 in a width of 1.5 μm. A p-InP clad layer 4, a SCH-strained MQW layer 5 and an n-InP clad layer 10, for example, are selectively grown on the surface of exposed p-InP buffer layer 2 with taking the silicon dioxide layer as a growth blocking mask. Hereinafter, the portion consisted of p-InP clad layer 4, the SCH-strained MQW layer 5 and the n-InP clad layer 10 will be referred to as a selective growth portion.

FIG. 2 is a diagrammatic illustration showing an energy-band structure of the SCH-strained MQW layer. In FIG. 2, the upper solid line represents edge 21 of conductivity band, and the lower solid line represents edge 22 of valence band. A first guide layer 6 of InGaAsP is formed on the surface of the p-InP clad layer 4. On the surface, five 0.7% compression strained InGaAsP well layers 7 are formed. Four non-strained InGaAsP barrier layers 8 having a band gap wavelength 1.13 μM are formed between well layers 7. Accordingly, an electron level in the well layer 7 is lower than the electron level of the barrier layer 8, and a hole level 24 in the well layer 7 becomes higher than the hole level of the barrier layer 8.

Also, a second guide layer consisted of InGaAsP is formed on the surface of the well layer 7. By these, SCH-strained MQW layer 5 is formed. The guide layers 6 and 9 have SCH (Separate Confinement Heterostructure) which are formed sandwiching the strained MQW layer, i.e. well layer 7 and the barrier layer 8. Accordingly, by the guide layers 6 and 9, a guided wave light in the strained MQW layer is confined.

The selective growth portion is surrounded by (100) plane and (111) B plane, which is in cross-sectionally trapezoidal configuration. Thereafter, a silicon dioxide layer is deposited on the entire surface. The thickness of the silicon dioxide layer at the (111) B plane of the selective growth portion becomes thinner than the thickness of the silicon dioxide layer at the (100) plane. Subsequently, the silicon dioxide layer at the (111) B layer is completely removed by performing etching over the entire surface. Then, the silicon dioxide layer is remained on the upper surface of the selective growth portion and on the surface of the buffer layer 2 where the selective growth portion is not formed.

Subsequently, in a form covering the selective growth portion, a positive resist having a width of 5 μm is formed by photolithography. Then, etching is performed for the silicon dioxide layer with buffered hydrofluoric acid. By such etching, the silicon dioxide layer at the (100) plane on the p-InP buffer layer 2 can be removed completely by side etching. However, since the silicon dioxide layer is discontinuous at the (111) B plane in the selective growth portion, the silicon dioxide layer at the (100) plane on the selective growth portion can be maintained without effecting the side etching.

Then, a p-InP buried layer 12, an n-InP blocking layer 13 and a p-InP blocking layer 14 are sequentially grown on the surface of the p-InP buffer layer 2 with taking the silicon dioxide layer as a growth blocking mask. Subsequently, after removing the silicon dioxide layer on the selective growth portion (on the surface of the n-InP clad layer 10), an n-InP clad buried layer 17 and an n+-InGaAsP contact layer 18 are grown sequentially. Thereafter, a surface electrode 19 is formed on the contact layer 18 by vapor deposition or sputtering. In conjunction therewith, the back surface of the p-InP substrate 1 is polished to form a back side electrode 20 over the entire back surface. Thus, the conventional MQW BH-Lds is fabricated.

In the MQW BH-LDs thus formed, when a voltage is applied to the surface electrode 19 and the back surface electrode 20, electron and hole are coupled in the strained MQW layer (active layer) to be converted into a light. Then, a light in the strained MQW is guided by means of the guide layers 6 and 9, a light wave continuously oscillating from an end face can be obtained.

However, in the MQW BH-LDS, it is possible to cause turn on by charge-up of the blocking layer at high temperature or upon high current injection.

SUMMARY OF THE INVENTION

An object of the present invention is to provide an optical semiconductor device having a carrier recombination layer, which can prevent turning on of a blocking layer due to charge-up, lower an internal loss in an optical waveguide, lower a threshold current, and which can improve increasing rate of an optical output from a front end face with respect to an injected current after oscillation.

An optical semiconductor device having a carrier recombination layer, according to the present invention, includes a p-type semiconductor layer and an optical waveguide formed on the surface of the p-type semiconductor layer. The optical waveguide has an active layer. Blocking layers are formed on both sides of an optical waveguide. Each of the blocking layer is consisted of a first p-type blocking layer formed on the surface of the semiconductor layer, an n-type blocking layer formed on the surface of the first p-type blocking layer, and a second p-type blocking layer formed on the surface of the n-type blocking layer. An n-type clad burying layer is formed over the optical waveguide and the blocking layer. A carrier recombination layer is provided between the blocking layer and the n-type clad burying layer. The carrier recombination layer has a multi-quantum well.

The multi-quantum well may have a separate confinement heterostructure. The active layer may include a multi-quantum well or strained multi-quantum well. The active layer and the carrier recombination layer may be electrically connected. Also, the semiconductor layer may be made of III-V group compound semiconductor. The semiconductor layer may has surface of (100) plane, and the optical waveguide may be extended in [011] orientation. However, the plane of the semiconductor layer and extending orientation of the optical waveguide are not essential but merely optional.

The optical waveguide may include clad layers formed with sandwiching the active layer. The multi-quantum well may have a well layer of InGaAsP.

An optical semiconductor device having a carrier recombination layer, according to the present invention, includes a p-type semiconductor layer and an optical waveguide formed on the surface of the p-type semiconductor layer. The optical waveguide has an active layer. Blocking layers are formed on both sides of an optical waveguide. Each of the blocking layer is consisted of a first p-type blocking layer formed on the surface of the semiconductor layer, an n-type blocking layer formed on the surface of the first p-type blocking layer, and a second p-type blocking layer formed on the surface of the n-type blocking layer. An n-type clad burying layer is formed over the optical waveguide and the blocking layer. A carrier recombination layer is provided between the blocking layer and the n-type clad burying layer. The carrier recombination layer has a strained multi-quantum well.

The multi-quantum well may have a separate confinement heterostructure. The active layer may include a multi-quantum well or strained multi-quantum well. The active layer and the carrier recombination layer may be electrically connected. Also, the semiconductor layer may be made of III-V group compound semiconductor. The semiconductor layer may has surface of (100) plane, and the optical waveguide may be extended in [011] orientation. However, the plane of the semiconductor layer and extending orientation of the optical waveguide are not essential but merely optional.

The optical waveguide may include clad layers formed with sandwiching the active layer. The multi-quantum well may have a well layer of InGaAsP. The optical semiconductor device may further comprise a p-type semiconductor substrate on which the p-type semiconductor layer is formed.

In the present invention, since the carrier recombination layer having the MQW or strained MQW is formed between the blocking layer and the clad burying layer, band gap of the carrier recombination layer in the vicinity of the active layer can be set large. Accordingly internal loss of guided wave light in the active layer can be reduced. Thus, threshold current can be lowered and, in conjunction therewith, slope effect can be improved.

Also, in the present invention, since the carrier recombination layer is consisted of the MQW or strained MQW, transition certainty and state density of the carrier recombination layer can be improved and whereby the carrier recombination efficiency can be improved. Accordingly, charge-up in the blocking layer is not caused, and thus turning on of the blocking layer of pnpn thyristor structure can be completely prevented. As a result, occurrence of leak current can be prevented to improve high temperature characteristics and high output characteristics.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

Figure 3:
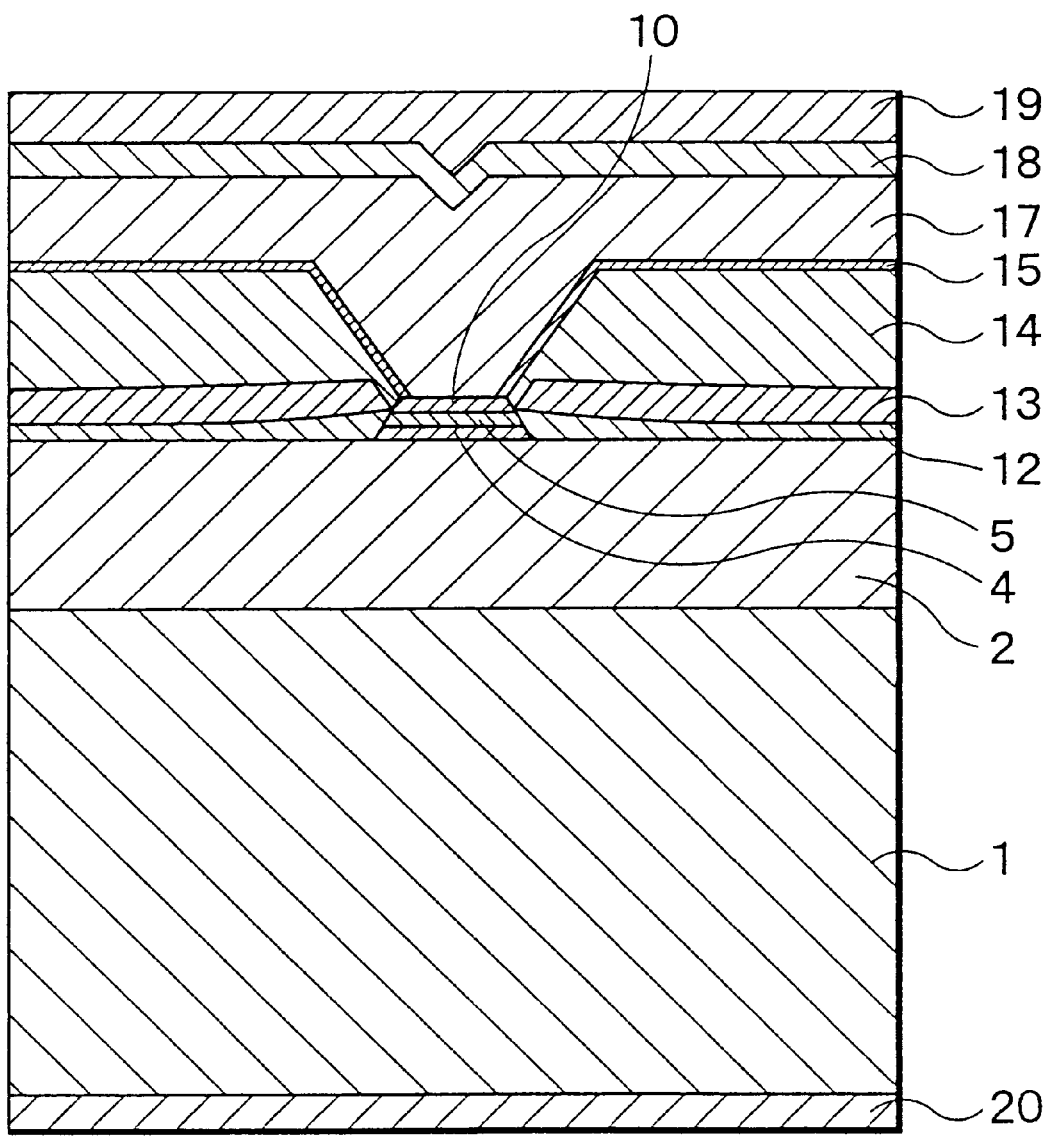
FIG. 3 is a section showing the first embodiment of an optical semiconductor device according to the present invention.

FIG. 3 is a section showing the first embodiment of an optical semiconductor device according to the present invention. On the entire surface of (100) plane of a p-type InP substrate 1, a p-InP buffer layer (semiconductor layer) 2 is formed in a thickness of 0.4 $\mu$m. Then, on the buffer layer 2, a p-InP clad layer 4 having a layer thickness of 50 nm, a SCH-strained MQW layer 5 having a layer thickness of 160 nm and an n-InP clad layer 10 having a layer thickness of 200 nm are grown in stripe form in [011] orientation, in sequential order. Hereinafter, the grown portion will be referred to as selective growth portion. The selective growth portion has trapezoidal cross-section with a bottom in a width of 1.5 μm and side surfaces of (111) B plane.

Figure 1:
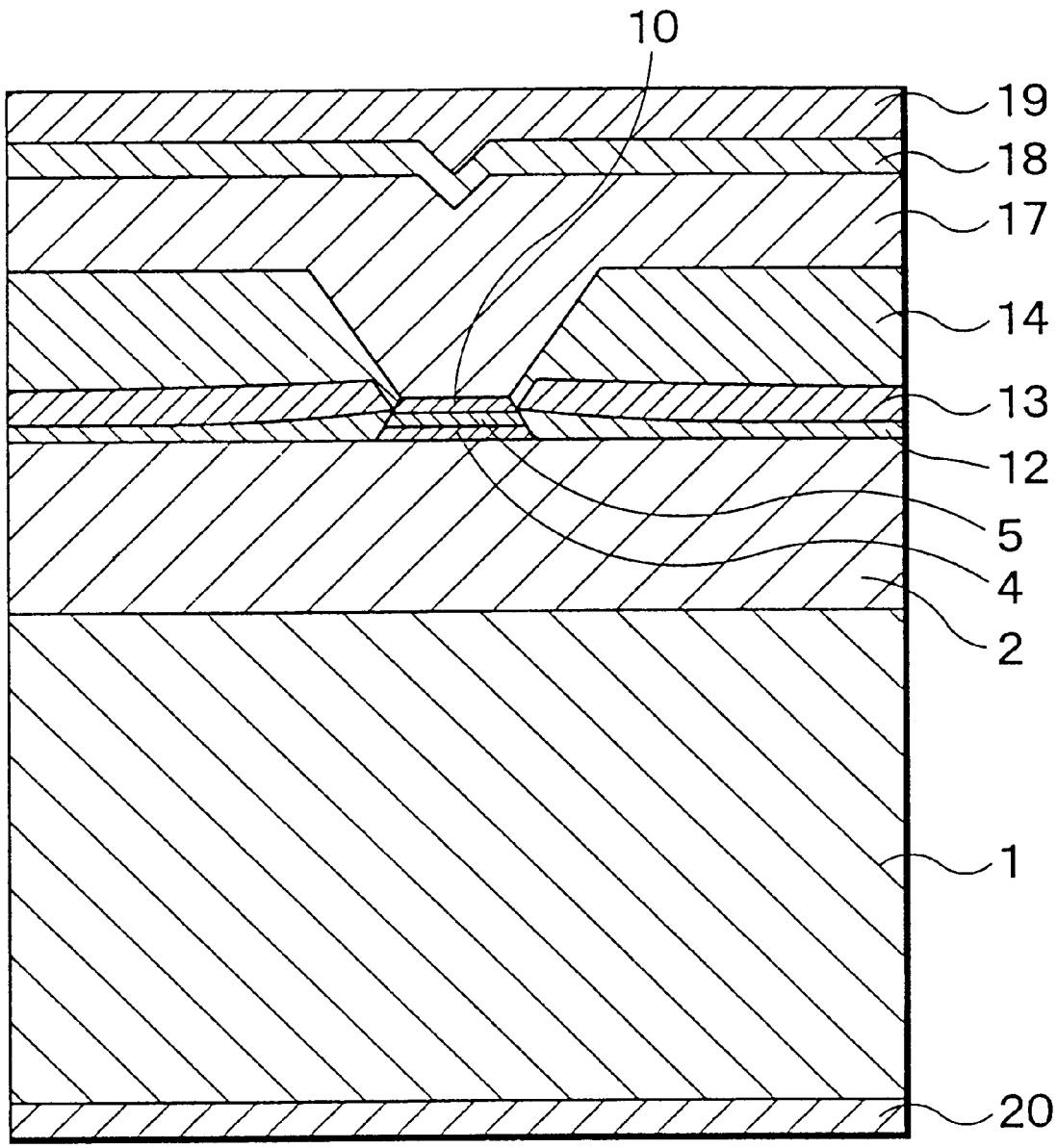
FIG. 1 is a section showing a structure of the conventional MQW (Multi-Quantum Well) BH-LDs.
Figure 2:
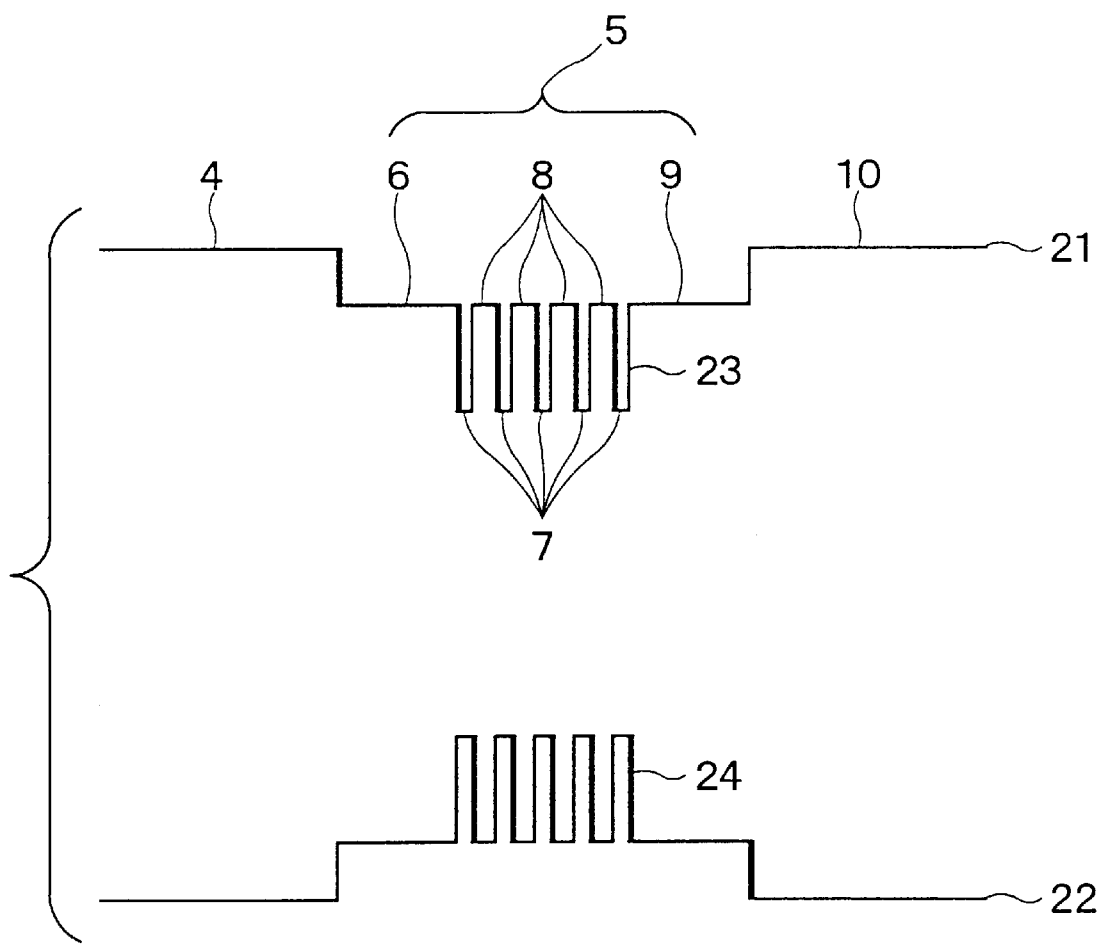
FIG. 2 is a diagrammatic illustration showing an energy band structure of SCH-strained MQW layer.

The energy band structure of the SCH-strained MQW layer 5 is similar to that shown in FIG. 2. An n-$In_{0.9}Ga_{0.1}As_{0.22}P_{0.78}$ guide layer 6 having a band gap wavelength of 1.05 μm and an n-$In_{0.9}Ga_{0.1}As_{0.22}P_{0.78}$ guide layer 9 are formed in layer thickness of 50 nm across the strained MQW layer. By these guide layers 6 and 9, the guided wave light of the strained MQW layer is confined. The strained MQW layer has five 1% compression strained $In_{0.9}Ga_{0.1}As_{0.52}P_{0.48}$ well layers 7 in a layer thickness of 4.5 nm. Then, non-strained $In_{0.9}Ga_{0.1}As_{0.22}P_{0.78}$ barrier layer 8 having a band gap of 1.05 μm is formed between these well layers 7 in a layer thickness of 10 nm.

On the other hand, on the surface of the buffer layer 2 in both sides of the selective growth portion, a p-InP buried layer (first p-type blocking layer) 12 in a layer thickness of 0.15 μm, an n-InP blocking layer (n-type blocking layer) 13 in a layer thickness of 0.4 μm, a p-InP blocking layer (second p-type blocking layer) 14 in a layer thickness of 1.2 μm and a SCH-MQW carrier recombination layer 15 in a layer thickness of 0.1 μm are selectively grown with preventing those layers from being formed on the upper surface of the selective growth portion.

Also, an n-InP clad burying layer 17 is formed in a form burying the upper portion of these layers. The clad burying layer 17 has a layer thickness of 2 μm on the upper portion of the n-InP clad layer 10. An n-InGaAsP contact layer 18 is formed in a layer thickness of 0.4 μm on the surface of the clad burying layer 17. A surface electrode 19 is formed with covering entire surface. In conjunction therewith, a back side electrode 20 is formed on the back surface of the p-type InP substrate 1.

Figure 4A:
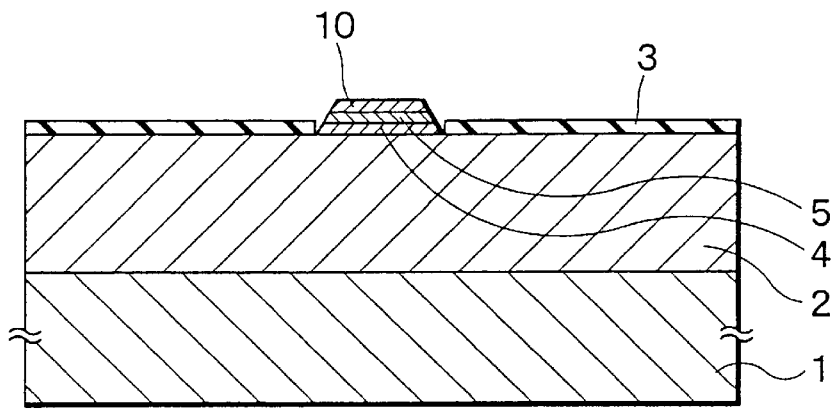
FIGS. 4A to 4C are sections showing fabrication process of the first embodiment of the optical semiconductor device according to the present invention, in order of sequence of steps.
Figure 4B:
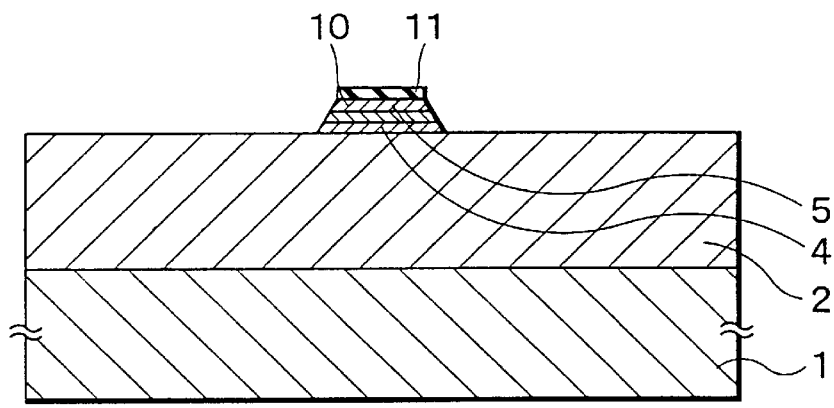
Figure 4C:
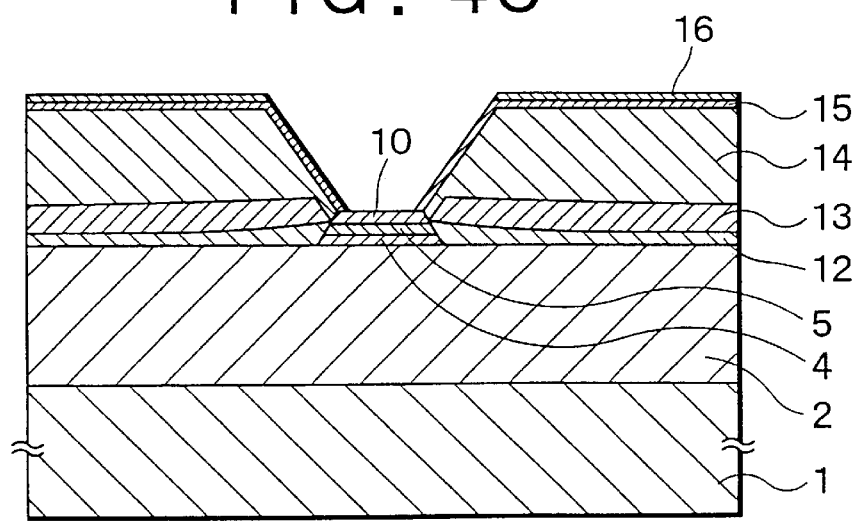

FIGS. 4A to 4C show sections showing the first embodiment of the fabrication process of the optical semiconductor device according to the present invention, in sequential order. At first, the p-InP buffer layer 2 is grown over the entire surface of the p-type InP substrate 1 having (100) plane, in a layer thickness of 2 μm by way of MO-VPE (metal-organic vapor phase epitaxy method). In the MO-VPE method, a III group material gas may be TMI (trimethyl indium) and TMG (trimethyl gallium), a V group material gas is $AsH_3$ (arsine) and $PH_3$ (phosfon). Also, an organic metal may be supplied by bubbling of hydrogen. Doping is performed with utilizing a gas, in which $Si_2H_6$ (disilane) or DMZn (dimethyl zinc) is used with dilution with hydrogen.

Next, the silicon dioxide layer 3 is formed on the buffer layer 2 in a layer thickness of 100 nm. A stripe form opening portion of [011] orientation is formed in a width of 1.5 μm by photolithography and dry etching. Then, utilizing the silicon dioxide layer 3 as the growth blocking mask, p-InP clad layer 4 having the layer thickness of 50 nm, the SCH-strained MQW layer 5 having 1.3 μm of a light emitting wavelength and a layer thickness of 160 nm, and the n-InP clad layer 10 having the layer thickness of 200 nm, in sequential order, by MO-VPE method.

As shown by the energy band structure of FIG. 2, the n-$In_{0.9}Ga_{0.1}As_{0.22}P_{0.78}$ guide layer 6 having the band gap wave length of 1.05 μm is grown on the surface of the p-InP clad layer 4 in a layer thickness of 50 nm. Then, the strained MQW layer (active layer) is grown on the surface of the guide layer 6, and the $In_{0.9}Ga_{0.1}As_{0.22}P_{0.78}$ guide layer 9 having the band gap wave length of 1.05 μm is grown in a layer thickness of 50 nm thereover. By this, the SCH-strained MQW layer is formed. The strained MQW layer (active layer) grown on the guide layer 6 is consisted of 1% compression strained $In_{0.9}Ga_{0.1}As_{0.52}P_{0.48}$ well layer 7 having layer thickness of 4.5 nm, the non-strained $In_{0.9}Ga_{0.1}As_{0.22}P_{0.78}$ barrier layer 8 having band gap wavelength of 1.05 μm and layer thickness of 10 nm, in which four barrier layers 8 are disposed between respective of five well layers 7.

The selective growth portion is surrounded by (100) plane and (111)B plane to have trapezoidal cross section. Thereafter, over the entire surface, the silicon dioxide layer is deposited in the layer thickness of 450 nm. At this time, the thickness of the silicon dioxide layer becomes 360 nm at the (111) B plane of the selective growth portion. Subsequently, entire surfaces of these layers are etched by buffered hydrofluoric acid to completely remove the silicon dioxide layer at the (111) B plane. Thus, the silicon dioxide layer is left in the layer thickness of 40 nm on the upper surface of the selective growth portion and on the surface of the buffer layer 2 where the selective growth portion is not formed.

Thereafter, covering the selective growth portion, the positive resist having a width of 5 μm is formed by photolithography. Then, silicon dioxide layer is etched by buffered hydrofluoric acid. The silicon dioxide layer at the (100) plane on the p-InP buffer layer 2 is completely removed by side etching. Since silicon dioxide layer is discontinuous at the (111) B plane in the selective growth portion, the silicon dioxide layer at the (100) plane on the selective growth portion is maintained without being side etched. As shown in FIG. 4B, when the resist is removed after side etching, silicon dioxide layer 11 in a layer thickness of 40 nm is remained on the ridge top on only surface of the n-InP clad layer 10 in self-align manner.

Subsequently, as shown in FIG. 4C, a p-InP buried layer 12 in a layer thickness of 0.15 μm, an n-InP blocking layer 13 in a layer thickness of 0.4 μm, a p-InP blocking layer 14 in a layer thickness of 1.2 μm, a SCH-MQW carrier recombination layer 15 in a layer thickness of 0.1 μm, and an n-InP layer 16 in a layer thickness of 0.2 μm are formed on the surface of the p-InP buffer layer 2 in a sequential order, with taking the silicon dioxide layer 11 as a growth blocking mask.

Figure 5:
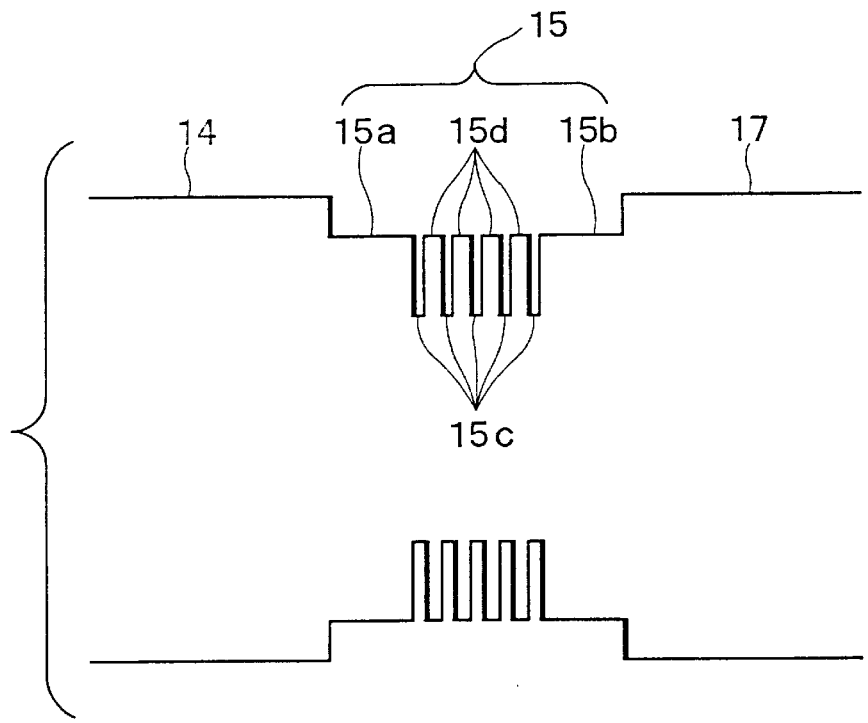
FIG. 5 is a diagrammatic illustration showing an energy band structure of the SCH-MQW carrier recombination layer 15.

An energy band structure of the SCH-MQW carrier recombination layer 15 is shown in FIG. 5. The SCH-MQW carrier recombination layer 15 is formed by growing a first InGaAsP layer (first SCH layer) 15a having band gap wavelength of 1.05 μm in a layer thickness of 30 nm on the surface of the p-InP blocking layer 14, then growing a MQW layer on the first SCH layer 15a, and forming a second InGaAsP layer (second SCH layer) 15b having band gap of 1.05 μm in a layer thickness of 30 nm. The MQW layer grown on the surface of the first InGaAsP layer 15a is formed by sequentially and alternately growing InGaAsP well layer 15c having band gap wave length of 1.3 μm and layer thickness of 3 nm and InGaAsP barrier layer 15d having band gap wavelength of 1.05 μm and layer thickness of 10 nm. In the shown embodiment, the barrier layers 15d are formed between five well layers 15c, respectively for forming the MQW layer.

It should be noted that the foregoing layer thickness is the layer thickness at (100) plane on the p-InP blocking layer 14. At the (111) plane extending toward the n-InP clad layer 10, the layer thickness becomes ⅕. Therefore, transition wavelength of the SCH-MQW carrier recombination layer is 1.2

µm at the (100) plane, where as the transition wavelength becomes 1.07 µm at the (111) B plane. On the other hand, at the (111) B plane, the electron level of the well layer matches with the electron level of the barrier layer. Accordingly, wave function of electron propagates over entire SCH-MQW carrier recombination layer 15, whereas wave function of hole is confined in the well layer. As a result, transition probability of the SCH-MQW carrier recombination layer 15 at the (111) B plane is significantly lowered.

Thereafter, as shown in FIG. 3, after removal of silicon dioxide layer 11 on the selective growth portion (on the surface of the n-InP clad layer 10), an n-InP clad buried layer 17 is grown in a layer thickness of 2 µm over the entire surface. By this, the n-InP layer 16 is integrated with the n-InP clad buried layer 17. Subsequently, on the surface of the clad buried layer 17, a n$^+$-InGaAsP contact layer 18 is grown in the layer thickness of 0.4 µm. Thereafter, a surface electrode 19 is formed on the contact layer 18 by vapor deposition method or sputtering layer. The backside of the p-InP substrate is polished in the wafer thickness of 100 µm. Then, a backside electrode 20 is formed on the over the entire back surface. Thus, a ASM-RIB-PBH laser shown in FIG. 3 is fabricated.

The carrier recombination layer 15 of SCH-MQW layer is formed in the ASM-RIB-PBH laser thus obtained. The thickness of the well layer 7 is thick at the (100) plane and thin at the (111) B plane. Accordingly, the transition energy of the recombination layer at the (111) B plane (band gap of the well layer) becomes greater than the transition energy of the recombination layer at the (100) plane. Thus, the transition wavelength of the MQW layer in the recombination layer 15 can be close to the light emitting wavelength of 1.3 µm of the active layer. Therefore, the carrier can be effectively recombined. Also, at the (111) B layer located in the vicinity of the active layer, the transition wavelength of the MQW layer in the recombination layer 15 becomes small so that absorption of guided wave light can be ignobly small.

In the shown embodiment, for example, the SCH layer and the barrier layer in the SCH-MQW carrier recombination layer are formed with InGaAsP layer having band gap wavelength of 1.05 µm. The well layer 7 is formed with InGaAsP layer having band gap wavelength of 1.3 µm. At this time, when the layer thickness of the well layer at the (100) plane is 3 µm, the layer thickness of the well layer at the (111) B plane become 0.6 nm. Then, the transition wavelength of the MQW layer at the (100) plane becomes 1.2 µm. On the other hand, the electron level of the well layer and the electron level of the barrier level are matched each other at the (111) B plane.

Thus, at the (100) plane, the effective band gap of the recombination layer becomes 1.2 µm which becomes close to the light emission wavelength of 1.3 µm of the active layer. Thus, the SCH-MQW layer can be effectively function as the carrier recombination layer. On the other hand, light absorption is caused at the (111) B plane at the band gap of 1.05 µm of SCH layer and the barrier layer. Therefore, the absorption of the oscillation light having light emission wavelength of 1.3 µm becomes ignobly small. Accordingly, turning on by the carrier recombination layer of the pnpn thyristor structure can be prevented at the layer at the (100) plane. Also, internal loss of the guided wave light can be significantly lowered.

Also, at the (111) B plane, while the electron level is discharged from the well layer, the hole level is still present within the well layer. The overlap of the wave functions of the electron and hole becomes small to make recombination certainty of the carrier smaller. Therefore, at the (111) B plane of the carrier recombination layer in the vicinity of the active layer, increasing of leakage current due to excessive progress of carrier recombination can be prevented. Thus, in the shown embodiment of the optical semiconductor device, the threshold current can be lowered. In conjunction therewith, a slope efficiency (increasing ratio of light output from the front end face with respect to the injected current after oscillation), the maximum light output and temperature characteristics can be improved.

The wafer is cleaved to have a resonator length of 300 µm, the coating layer to obtain reflectance of 30% is formed on the front end surface of the resonator, and the coating layer to obtain reflectance of 75% is formed on the rear end surface of the resonator to evaluate light output characteristics of the resonator. As a result, a semiconductor laser device having a threshold current of 5 mA and slope efficiency of 0.5 (W/A) can be obtained. On the other hand, the internal loss of light to guide the active layer becomes 8 cm$^{-1}$. Also, the wafer is cleaved to have the resonator length of 150 µm, the coating layer having the reflectance of the front end face of 80% and the reflectance of the rear end face of 95% is formed to evaluate the light output characteristics. When the injection current is set at 30 mA, fluctuation of light output within a temperature range of 40° C. to 80° C. became less than or equal to 2 dB.

On the other hand, as a comparative example, in place of the SCH-MQW carrier recombination layer 15, a bulk of InGaAsP recombination layer was formed and the light output characteristics is evaluated similarly to the shown embodiment. As a result, the threshold current of the obtained semiconductor layer device was 7 mA, and the slope efficiency was 0.42 (W/A). The internal loss of the light guided through the active layer was 13 cm$^{-1}$. It should be noted that the saturated current of the resonator in the shown embodiment was higher than that of the resonator of the comparative example in the extent of 10 to 20%.

As set forth above, when the bulk of InGaAsP recombination layer is formed in place of the SCH-MQW carrier recombination layer 15, the InGaAsP recombination layer grows even at the (111) B plane to increase internal loss of the optical waveguide to elevate the threshold current and lower slope efficiency. This is because that the InGaAsP recombination layer is formed in the vicinity of the active layer at the (111) B plane, the field of the light is resisted by the InGaAsP at the (111) B plane.

Also, when the bulk of InGaAsP recombination layer is formed, since coupling efficiency of the carrier is degraded, the current blocking layer may not be satisfactorily effective upon injection of high current to cause high output saturation.

In the shown embodiment, since the carrier recombination layer 15 is formed with MQW, the band gap of the carrier recombination layer 15 at the (111) B plane in the vicinity of the active layer can be made large. Accordingly, the internal loss of the guided wave light in the active layer can be reduced. Thus, the threshold current can be lowered and slope efficiency can be improved.

Also, in the shown embodiment, since the carrier recombination layer 15 is constructed with the MQW, transition certainty and state density of the carrier recombination layer 15 can be improved and whereby the recombination efficiency of the carrier can be improved. Accordingly, charge-up in the blocking layer will never be caused and turning on of the blocking layer in the pnpn thyristor structure can be completely prevented. As a result, occurrence of leakage current can be successfully prevented to improved high temperature characteristics and high output characteristics.

Figure 6:
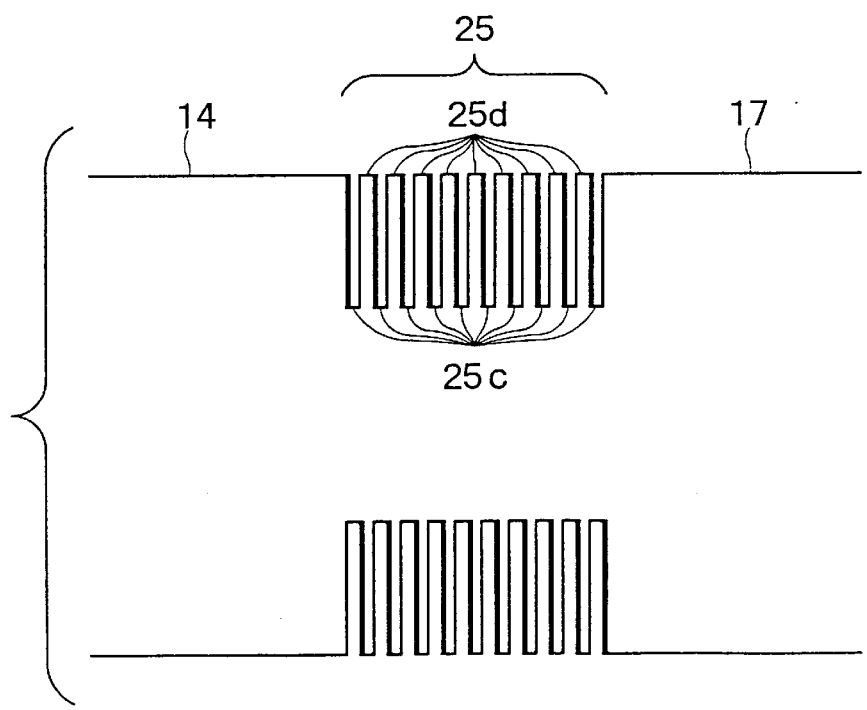
FIG. 6 is a diagrammatic illustration showing an energy band of a MQW carrier recombination layer for which the SCH layer is not formed.

In the first embodiment shown in FIG. 3, it may be possible not to form the SCH layer in the SCH-MQW carrier recombination layer 15, i.e. the first and second InGaAsP layers 15a and 15b, but the barrier layer may be formed by the InP layer. The energy band structure of the MQW carrier recombination layer without forming the SCH is illustrated in FIG. 6. In this case, the well layer 25c having the band gap wavelength of 1.2 μm is formed within the MQW layer 25, the electron level of the well layer 25c and the electron level of the barrier layer 25d are matched at the (111) B plane to each other to overflow the electron to the InP layer, to cause the state where carrier recombination layer is not present and the internal loss of the light generated by the carrier recombination layer can be completely prevented. It should be noted that the carrier recombination layer at the (100) plane should have large band gap, it is preferable to increase number of wells 25c, e.g. ten layers, for improving the carrier recombination efficiency.

Figure 7:
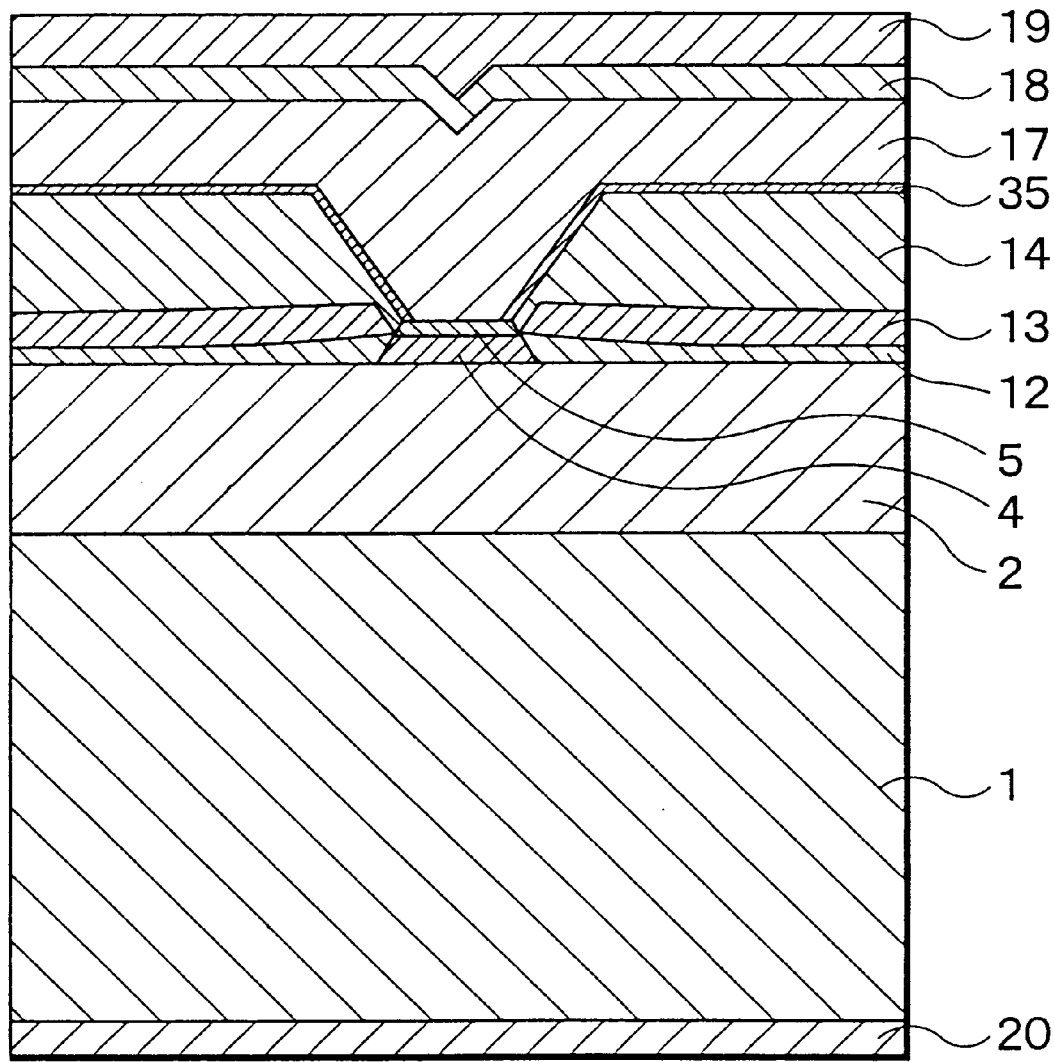
FIG. 7 is a section showing the second embodiment of an optical semiconductor device according to the present invention.

FIG. 7 is a section of the second embodiment of the optical semiconductor device according to the present invention. In the second embodiment shown in FIG. 7, like elements to those shown in FIG. 3 will be identified by like reference numerals and detailed description for such common elements will be neglected for the sake of simplification of disclosure. The shown embodiment is differentiated from the first embodiment in that, the n-InGaAsP clad layer is not formed at the uppermost portion of the selective growth portion, and in place of the SCH-MQW carrier recombination layer 15, a SCH-strained MQW carrier recombination layer 35 is formed.

In the shown embodiment, since the strained MQW layer is used as the carrier recombination layer, the recombination efficiency of the carrier can be further improved. Also, since the n-InP clad layer is not formed on the SCH-strained MQW carrier recombination layer, the SCH-strained MQW carrier recombination layer 35 at the (111) B plane and the active layer of the SCH-strained MQW layer 5 can be electrically connected. Accordingly, the injected carrier can be injected into the active layer without causing any leakage with passing the SCH-strained MQW layer 35 at the (111) plane. It should be noted that, the second embodiment of the optical semiconductor device shows a construction having no InP clad layer to be implanted.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

For example, while the foregoing embodiments employ InGaAsP/InP type semiconductor material, other compound semiconductor, such as III-V group compound semiconductor, InGaAsP and so forth can be employed. Also, while the structure of the optical semiconductor device according to the present invention is obtained by utilizing selective growth technology, it is also applicable for spot size conversion element and modulation integrated type DFB-LD.

What is claimed is:
1. An optical semiconductor device having a carrier recombination layer comprising:
   a p-type semiconductor layer;
   an optical waveguide formed on a surface of said p-type semiconductor layer and having an active layer;
   blocking layers formed on both sides of said optical waveguide, said blocking layers including
      a first p-type blocking layer formed on a surface of said semiconductor layer;
      an n-type blocking layer formed on a surface of said first p-type blocking layer; and
      a second p-type blocking layer formed on a surface of said n-type blocking layer;
   an n-type clad burying layer formed over said optical waveguide and said blocking layers; and
   a carrier recombination layer provided between said blocking layers and said n-type clad burying layer and having a multi-quantum well.
2. An optical semiconductor device as set forth in claim 1, wherein said multi-quantum well has a separate confinement heterostructure.
3. An optical semiconductor device as set forth in claim 1, wherein said active layer includes a multi-quantum well.
4. An optical semiconductor device as set forth in claim 1, wherein said active layer includes a strained multi-quantum well.
5. An optical semiconductor device as set forth in claim 1, wherein said active layer and said carrier recombination layer are electrically connected.
6. An optical semiconductor device as set forth in claim 1, wherein said semiconductor layer is made of III-V group compound semiconductor.
7. An optical semiconductor device as set forth in claim 1, wherein said semiconductor layer has surface of (100) plane, and said optical waveguide is extended in [011] orientation.
8. An optical semiconductor device as set forth in claim 1, wherein said optical waveguide includes clad layers formed with sandwiching said active layer.
9. An optical semiconductor device as set forth in claim 1, wherein said multi-quantum well has well layers of InGaAsP.
10. An optical semiconductor device as set forth in claim 1, further comprising a p-type semiconductor substrate on which said semiconductor layer is formed.
11. An optical semiconductor device having a carrier recombination layer comprising:
   a p-type semiconductor layer;
   an optical waveguide formed on a surface of said p-type semiconductor layer and having an active layer;
   blocking layers formed on both sides of said optical waveguide, said blocking layers including
      a first p-type blocking layer formed on a surface of said semiconductor layer;
      an n-type blocking layer formed on a surface of said first p-type blocking layer; and
      a second p-type blocking layer formed on a surface of said n-type blocking layer;
   an n-type clad burying layer formed over said optical waveguide and said blocking layers; and
   a carrier recombination layer provided between said blocking layers and said n-type clad burying layer and having a strained multi-quantum well.
12. An optical semiconductor device as set forth in claim 11, wherein said multi-quantum well has a separate confinement heterostructure.

13. An optical semiconductor device as set forth in claim 11, wherein said active layer includes a multi-quantum well.

14. An optical semiconductor device as set forth in claim 11, wherein said active layer includes a strained multi-quantum well.

15. An optical semiconductor device as set forth in claim 11, wherein said active layer and said carrier recombination layer are electrically connected.

16. An optical semiconductor device as set forth in claim 11, wherein said semiconductor layer is made of III-V group compound semiconductor.

17. An optical semiconductor device as set forth in claim 11, wherein said semiconductor layer has surface of (100) plane, and said optical waveguide is extended in [011] orientation.

18. An optical semiconductor device as set forth in claim 11, wherein said optical waveguide includes clad layers formed with sandwiching said active layer.

19. An optical semiconductor device as set forth in claim 11, wherein said multi-quantum well has well layers of InGaAsP.

20. An optical semiconductor device as set forth in claim 11, further comprising a p-type semiconductor substrate on which said semiconductor layer is formed.

21. An optical semiconductor device as set forth in claim 5, further comprising:
   a selective growth structure which includes said active layer, said carrier recombination layer being formed so as to contact the selective growth structure.

22. An optical semiconductor device as set forth in claim 21, wherein said carrier recombination layer contacts a top surface of the selective growth structure.

23. An optical semiconductor device as set forth in claim 21, wherein, in the selective growth structure, said active layer is disposed between two clad layers, said carrier recombination layer contacting one of said two clad layers.

24. An optical semiconductor device as set forth in claim 1, wherein said carrier recombination layer contains said multi-quantum well formed between first and second SCH layers.

25. An optical semiconductor device as set forth in claim 24, wherein said multi-quantum well includes alternating InGaAsP well layers and InGaAsP barrier layers.

26. An optical semiconductor device as set forth in claim 15, further comprising:
   a selective growth structure which includes said active layer, said carrier recombination layer being formed so as to contact the selective growth structure.

27. An optical semiconductor device as set forth in claim 26, wherein said carrier recombination layer contacts a top surface of the selective growth structure.

28. An optical semiconductor device as set forth in claim 26, wherein said carrier recombination layer directly contacts said active layer.

29. An optical semiconductor device as set forth in claim 11, wherein said carrier recombination layer contains said multi-quantum well formed between first and second SCH layers.

30. An optical semiconductor device as set forth in claim 29, wherein said multi-quantum well includes alternating InGaAsP well layers and InGaAsP barrier layers.

* * * * *